(12) United States Patent
Tauchi et al.

(10) Patent No.: US 7,695,790 B2
(45) Date of Patent: Apr. 13, 2010

(54) SILVER ALLOY REFLECTIVE FILM, SPUTTERING TARGET THEREFOR, AND OPTICAL INFORMATION RECORDING MEDIUM USING THE SAME

(75) Inventors: Yuuki Tauchi, Kobe (JP); Junichi Nakai, Kobe (JP); Katsutoshi Takagi, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 960 days.

(21) Appl. No.: 11/158,079

(22) Filed: Jun. 22, 2005

(65) Prior Publication Data

US 2006/0013988 A1 Jan. 19, 2006

(30) Foreign Application Priority Data

Jul. 15, 2004 (JP) ............................. 2004-208686
Mar. 10, 2005 (JP) ............................. 2005-067262

(51) Int. Cl.
*B32B 3/02* (2006.01)
(52) U.S. Cl. ................. 428/64.1; 428/64.4; 430/270.12
(58) Field of Classification Search ................ 428/64.1, 428/64.4; 430/270.12
See application file for complete search history.

(56) References Cited

U.S. PATENT DOCUMENTS

| 4,998,239 | A | * | 3/1991 | Strandjord et al. ....... 369/275.1 |
| 5,948,497 | A | | 9/1999 | Hatwar et al. |
| 5,989,669 | A | * | 11/1999 | Usami ...................... 428/64.1 |
| 6,007,889 | A | | 12/1999 | Nee |
| 6,280,811 | B1 | | 8/2001 | Nee |
| 6,544,616 | B2 | | 4/2003 | Nee |
| 6,689,444 | B2 | | 2/2004 | Nakai et al. |
| 6,788,635 | B1 | * | 9/2004 | Aratani et al. ............. 369/100 |
| 2002/0150772 | A1 | | 10/2002 | Nakai et al. |
| 2003/0143342 | A1 | | 7/2003 | Fujii et al. |
| 2003/0215598 | A1 | | 11/2003 | Nee |

(Continued)

FOREIGN PATENT DOCUMENTS

EP   1 371 749 A1   12/2003

(Continued)

OTHER PUBLICATIONS

U.S. Appl. No. 10/999,027, filed Nov. 30, 2004, Takagi, et al.

(Continued)

*Primary Examiner*—Elizabeth Mulvaney
(74) *Attorney, Agent, or Firm*—Oblon, Spivak, McClelland, Maier & Neustadt, L.L.P.

(57) ABSTRACT

A Ag alloy reflective film for an optical information recording medium contains Ag as a main component, and at least one selected from Nd, Sn, Gd and In in a total amount of more than 3.0 atomic percent and less than or equal to 10 atomic percent. The reflective film can further contain 0.01 to 3 atomic percent of at least one of Bi and Sb, and/or can further contain comprising 20 atomic percent or less of at least one of Mn, Cu, La and Zn. An optical information recording medium includes the Ag alloy reflective film and can be subjected to laser marking. A Ag alloy sputtering target has a similar composition to that of the Ag alloy reflective film.

19 Claims, 1 Drawing Sheet

U.S. PATENT DOCUMENTS

| | | | |
|---|---|---|---|
| 2004/0028912 A1* | 2/2004 | Tauchi et al. | 428/434 |
| 2004/0226818 A1 | 11/2004 | Takagi et al. | |
| 2004/0238356 A1 | 12/2004 | Matsuzaki et al. | |
| 2004/0258872 A1* | 12/2004 | Nee | 428/64.4 |
| 2004/0263984 A1* | 12/2004 | Nakai et al. | 359/586 |
| 2005/0008883 A1* | 1/2005 | Takagi et al. | 428/469 |

FOREIGN PATENT DOCUMENTS

| | | |
|---|---|---|
| EP | 1 589 531 A2 | 10/2005 |
| JP | 6-208732 A | 7/1994 |
| JP | 7-315874 | 12/1995 |
| JP | 2002-15464 | 1/2002 |
| JP | 2003-160826 | 6/2003 |
| JP | 2004-139712 | 5/2004 |
| TW | 474999 | 2/2002 |
| TW | 583323 | 4/2004 |
| WO | WO 2004/006228 A2 | 1/2004 |

OTHER PUBLICATIONS

U.S. Appl. No. 11/103,615, filed Apr. 12, 2005, Takagi, et al.
U.S. Appl. No. 11/333,492, filed Jan. 18, 2006, Tauchi, et al.
U.S. Appl. No. 11/375,036, filed Mar. 15, 2006, Tauchi, et al.
U.S. Appl. No. 11/428,045, filed Jun. 30, 2006, Fujii, et al.
U.S. Appl. No. 11/425,062, filed Jun. 19, 2006, Tauchi, et al.
U.S. Appl. No. 11/425,068, filed Jun. 19, 2006, Nakai, et al.
U.S. Appl. No. 11/612,791, filed Dec. 19, 2006, Nakano, et al.
U.S. Appl. No. 12/183,700, Jul. 31, 2008, Tauchi, et al.
U.S. Appl. No. 12/198,520, Aug. 26, 2008, Tauchi, et al.
U.S. Appl. No. 12/167,597, filed Jul. 3, 2008, Takagi, et al.
U.S. Appl. No. 12/261,781, filed Oct. 30, 2008, Matsuzaki.
U.S. Appl. No. 12/266,065, filed Nov. 6, 2008, Tauchi, et al.

* cited by examiner

SILVER ALLOY REFLECTIVE FILM, SPUTTERING TARGET THEREFOR, AND OPTICAL INFORMATION RECORDING MEDIUM USING THE SAME

BACKGROUND OF THE INVENTION

Field of the Invention

The present invention relates to a Ag alloy reflective film for an optical information recording medium; an optical information recording medium using the Ag alloy reflective film, and a Ag alloy sputtering target for the deposition of the Ag alloy reflective film. More specifically, it relates to a reflective film which exhibits a low thermal conductivity, low melting point, high reflectivity and high corrosion resistance for enabling laser marking after the preparation of a disc in the field of optical information recording media such as compact disc (CD), digital versatile disc (DVD), Blu-ray Disc, and high definition DVD (HD DVD). It also relates to a sputtering target which is used in depositing the reflective film; and an optical information recording medium having the reflective film.

Optical information recording media (optical discs) include various types, and the three main types categorized by the writing/reading system are read-only, write-once, and rewritable optical discs.

Of these optical discs, a read-only optical disc has a structure as shown in FIG. 1, in which data are recorded as convex and concave pits on a transparent plastic substrate during the manufacture of the disc, and a reflective layer is formed typically from Al, Ag or Au thereon. The recorded data are reproduced (read out) by detecting a difference in phase or reflection of laser light applied to the disc. Certain optical discs each containing laminated two substrates have two recording layers. One of the two substrates has recording pits and is covered by a reflective layer, and the other has different recording pits and is covered by a semi-reflective layer. The data according to this writing/reading system, namely, single side, dual layer system, are read-only and can be neither rewritten nor changed. Examples of such optical discs according to this writing/reading system are CD-ROM and DVD-ROM. FIG. 1 is a schematic cross sectional view of an optical disc. The optical disc includes a polycarbonate substrate 1, a semi-reflective layer 2 made typically of Au, Ag alloy or Si, an adhesive layer 3, a reflective layer 4 made typically of a Ag alloy, and a protective layer 5 made typically from an ultraviolet curable resin.

Such read-only optical discs cannot significantly have a respective identification (ID), since these discs are produced in a large quantity where information to be written is pressed on the discs using a stamper during their manufacture. Read-only optical discs having a respective identification, however, have been developed for preventing illegal duplication, improving the traceability during commercial distribution and increasing added values of the discs. The identification (ID) is recorded on the discs according to, for example, a Label Gate system or burst cutting area (BCA) system with a dedicated apparatus after the manufacture of the discs. The ID is generally marked by irradiating laser beam to a disc after its manufacture, thereby melting and puncturing the Al alloy of the reflective film.

Such reflective films of read-only optical discs have generally been prepared from Al alloys such as an Al alloy according to the specification in Japanese Industrial Standards (JIS) A 6061 (Al—Mg alloy). Such Al alloys are widely distributed as a general-purpose constitutional material and are thereby inexpensive.

The Al alloy according to JIS A 6061, however, is not directed to laser marking process and has the following problems.

The Al alloy according to JIS A 6061 has a high thermal conductivity and thus requires a high laser power for marking, which invites damage, for example, on the polycarbonate substrate or the adhesive layer. In addition, the alloy has low corrosion resistance, has cavities as a result of the laser marking, and the resulting reflective film cannot avoid corrosion after laser marking. The corrosion resistance herein can be determined in a test with constant temperature and humidity.

Recordable optical discs such as write-once optical discs and rewritable optical discs generally employ Ag alloys for their higher reflectivity. A reflective film made from a Ag alloy, however, is susceptible to cohesion at high temperatures due to its low heat resistance. Various proposals have been made to avoid this problem and to improve the durability of such a Ag alloy. For example, Japanese Patent Application Laid-open No. 2002-15464 discloses prevention of growth of crystal grain (cohesion) of Ag by adding 0.1 to 3 atomic percent of a rare earth element to Ag. Japanese Patent Application Laid-open No. 2004-139712 discloses improvement in reflectivity and durability while maintaining high thermal conductivity by incorporating Bi or Sb into Ag.

The thermal conductivity of the Ag alloy is reduced in Japanese Patent Application Laid-open No. 04-25440 and No. 04-28032 by adding an alloying element to Ag. These reflective films, however, are not directed to laser marking in which the film is melted and removed by laser irradiation. Accordingly, no Ag alloy has been provided to have a reduced thermal conductivity and a reduced melting temperature simultaneously to thereby satisfy requirements as a Ag alloy for use in laser marking.

As is described above, a Ag alloy for use in laser marking must have a low thermal conductivity, low melting temperature, high corrosion resistance and high heat resistance.

The Al alloy according to JIS A 6061 generally used in read-only optical discs cannot be used in laser marking due to its high thermal conductivity and low corrosion resistance.

SUMMARY OF THE INVENTION

Under these circumstances, an object of the present invention is to provide a Ag alloy reflective film for an optical information recording medium, which enables easy laser marking on a read-only optical disc. Another object of the present invention is to provide an optical information recording medium having the reflective film. Yet another object of the present invention is to provide a sputtering target for the deposition of the reflective film.

After intensive investigations to achieve the above objects, the present inventors have found that a Ag alloy thin film containing a specific amount of at least one specific alloying element in addition to Ag has a low thermal conductivity, low melting temperature and high corrosion resistance and is suitable for use in laser marking as a reflective thin film layer (metal thin film layer) for an optical information recording medium. The present invention has been achieved based on these findings.

Accordingly, the present invention relates to a Ag alloy reflective film for an optical information recording medium, an optical information recording medium, and a Ag alloy sputtering target for the deposition of Ag alloy reflective film having the following configurations.

Specifically, the present invention provides, in a first aspect, a Ag alloy reflective film for an optical information recording medium, containing Ag as a main component, and at least one selected from the group consisting of Nd, Sn, Gd and In in a total amount of more than 3.0 atomic percent and less than or equal to 10 atomic percent.

The Ag alloy reflective film can further contain 0.01 to 3 atomic percent of at least one of Bi and Sb.

In addition or alternatively, the Ag alloy reflective film can further contain 20 atomic percent or less of at least one selected from the group consisting of Mn, Cu, La and Zn.

The present invention further provides, in a second aspect, an optical information recording medium having the Ag alloy reflective film of the present invention.

The optical information recording medium can be subjected to laser marking.

In addition and advantageously, the present invention provides a Ag alloy sputtering target for the deposition of a Ag alloy reflective film, containing Ag as a main component, and at least one selected from the group consisting of Nd, Sn, Gd and In in a total amount of more than 3.0 atomic percent and less than or equal to 10 atomic percent.

The Ag alloy sputtering target can further contain 0.01 to 3 atomic percent of Sb.

The Ag alloy sputtering target can further contain 0.03 to 10 atomic percent of Bi.

In addition or alternatively, the Ag alloy reflective film can contain 20 atomic percent or less of at least one selected from the group consisting of Mn, Cu, La and Zn.

The Ag alloy reflective film for an optical information recording medium according to the present invention enables easy laser marking on a read-only optical disc. The optical information recording medium according to the present invention has the Ag alloy reflective film and enables easy laser marking when used as a read-only optical disc. The Ag alloy sputtering target according to the present invention enables the deposition of such a Ag alloy reflective film.

Further objects, features and advantages of the present invention will become apparent from the following description of the preferred embodiments with reference to the attached drawing.

DESCRIPTION OF THE PREFERRED EMBODIMENTS

Figure 1:
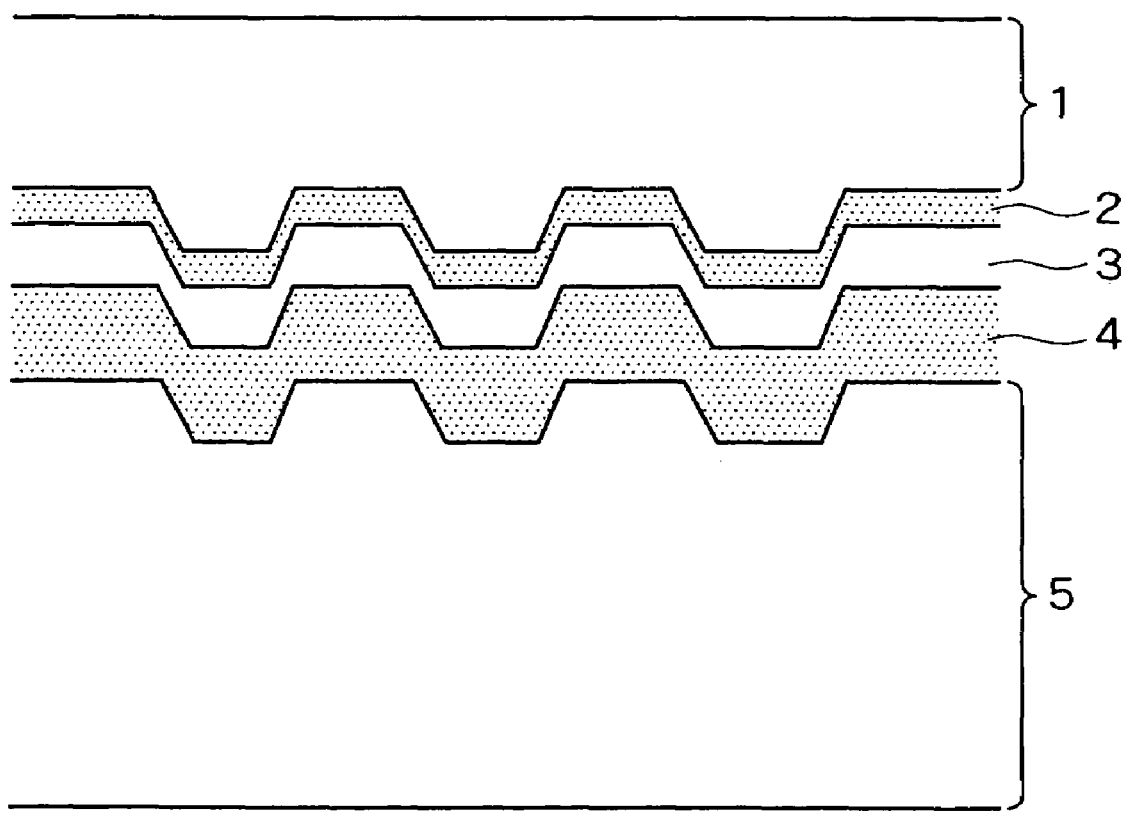
FIG. 1 is a schematic sectional view of a configuration of a read-only optical disc.

As is described above, a Ag alloy for use in laser marking must have a low thermal conductivity, low melting temperature and high corrosion resistance.

The present inventors prepared Ag alloy sputtering targets by adding various elements to Ag, prepared Ag alloy thin films having different compositions by sputtering using these targets, determined their compositions and properties as reflective thin films and found the following findings (1), (2) and (3).

(1) The thermal conductivity can be reduced without elevating the melting temperature (liquidus temperature) by adding to Ag at least one, namely one or more elements selected from Nd, Sn, Gd and In in a total amount of more than 3.0 atomic percent and equal to or less than 10 atomic percent. If the total amount of the at least one element is 3.0 atomic percent (hereinafter briefly referred to as percent or %) or less, the thermal conductivity is not effectively reduced. If it exceeds 10 atomic percent, the reflectivity significantly decreases. By adding more than 3 atomic percent and equal to or less than 10 atomic percent of at least one of these elements, the resulting reflective film can have a reduced thermal conductivity and melting temperature and exhibit improved durability. More specifically, the reflective film is resistant to corrosion and cohesion and prevents decrease in reflectivity under high temperature and high humidity conditions in a test with constant temperature and humidity after laser marking (hereinafter referred to as "decreased reflectivity due to corrosion or cohesion in the test with constant temperature and humidity").

(2) The decreased reflectivity due to corrosion or cohesion in the test with constant temperature and humidity can be significantly prevented by further adding at least one of Bi and Sb in addition to at least one selected from Nd, Sn, Gd and In in the specific amount. The total content of Bi and/or Sb is preferably 3 atomic percent or less for preventing, as a result of alloying, decrease in reflectivity. It is also preferably 0.01 atomic percent for satisfactory effects of the alloying. The total content of Bi and Sb is more preferably 0.1 atomic percent or more and 2.0 atomic percent or less.

(3) The thermal conductivity can be significantly reduced by further adding at least one of Mn, Cu, La and Zn. The total content of these elements is preferably 20 atomic percent or less for preventing, as a result of alloying, decrease in reflectivity. These elements, however, do not significantly contribute to improvement in the durability of the resulting reflective film. For further effectively reducing the thermal conductivity, the total content of these elements is preferably 0.1 atomic percent or more and more preferably 1.0 atomic percent or more.

The present invention has been achieved based on these findings and provides the Ag alloy reflective film for an optical information recording medium, the optical information recording medium, and the Ag alloy sputtering target for the deposition of the Ag alloy reflective film having the above configurations.

Thus, the Ag alloy reflective film according to the first embodiment of the present invention is for use in an optical information recording medium, mainly comprises Ag and further comprises at least one of Nd, Sn, Gd and In in a total content of more than 3.0 atomic percent and equal to or less than 10 atomic percent.

The Ag alloy reflective film can have a reduced thermal conductivity and improved durability without elevating its melting temperature (liquidus temperature) by comprising at least one of Nd, Sn, Gd and In in a total content of more than 3.0 atomic percent and equal to or less than 10 atomic percent as described in the finding (1).

The Ag alloy reflective film according to the present invention therefore has a low thermal conductivity, low melting temperature and high corrosion resistance, can be suitably used in laser marking and can be advantageously used as a reflective film for an optical information recording medium. More specifically, the low melting temperature of the Ag alloy reflective film enables easy laser marking. The low thermal conductivity thereof does not require excessive laser output and reduces the laser output in the laser marking, which in turn avoids thermal damage of constitutional members of the disc such as polycarbonate substrate and adhesive layer due to excessive laser output. In addition, the high corrosion resistance prevents the decreased reflectivity due to corrosion or cohesion caused by water migrated into cavities formed after laser marking.

By further comprising 0.01 to 3 atomic percent of at least one of Bi and Sb, the Ag alloy reflective film according to the second embodiment significantly prevents the decreased reflectivity due to corrosion or cohesion in the test with constant temperature and humidity, as described in the finding (2).

By further comprising 20 atomic percent or less of at least one of Mn, Cu, La and Zn, the Ag alloy reflective film according to the third embodiment can have a further reduced thermal conductivity, as described in the finding (3).

The thickness of the Ag alloy reflective film is preferably 10 nm to 200 nm, and more preferably 20 nm to 100 nm. If the thickness is less than 10 nm, the reflective film may transmit light and have a decreased reflectivity, although such a thin film is advantageous for laser marking. The thickness of the reflective film is thus preferably 10 nm or more and more preferably 20 nm or more. In contrast, the thickness is preferably 200 nm or less, and more preferably 100 nm or less, because a Ag alloy reflective film having an excessively large thickness may require a larger energy for laser marking so as to fuse the reflective film. In addition, with an increasing thickness, the reflective film may have a decreased surface smoothness, may scatter light more and fail to obtain a high signal output.

The optical information recording medium according to the present invention comprises the Ag alloy reflective film of the present invention. The optical information recording medium can be suitably subjected to laser marking, is free from thermal damage of constitutional members thereof, such as the polycarbonate substrate and adhesive layer, due to excessive laser output. In addition, the optical information recording medium has high corrosion resistance and is resistant to the decreased reflectivity due to corrosion or cohesion.

The optical information recording medium according to the present invention has such satisfactory properties and can be particularly advantageously used in laser marking.

The Ag alloy sputtering target for the deposition of a Ag alloy reflective film according to the present invention mainly comprises Ag and further comprises at least one selected from the group consisting of Nd, Sn, Gd and In in a total amount of more than 3.0 atomic percent and less than or equal to 10 atomic percent. The Ag alloy sputtering target enables the deposition of the Ag alloy reflective film for an optical information recording medium according to the present invention.

By further comprising 0.01 to 3 atomic percent of Sb, the Ag alloy sputtering target enables the deposition of the Ag alloy reflective film according to the second embodiment, wherein the Ag alloy reflective film comprises 0.01 to 3 atomic percent of Sb. When the Ag alloy sputtering target further comprises 0.03 to 10 atomic percent of Bi, it enables the deposition of the Ag alloy reflective film according to the second embodiment, wherein the Ag alloy reflective film comprises 0.01 to 3 atomic percent of Bi. The Bi content in the target is higher than the Bi content in the reflective film since the amount of Bi in the resulting reflective film reduces to several dozen percent of the Bi that had been present in the target in the course of depositing the reflective film. In this connection, the content of the Nd, Sn, G, In or Sb in the target is substantially equal to the content in the resulting reflective film.

By further comprising 20 atomic percent or less of at least one of Mn, Cu, La and Zn, the Ag alloy sputtering target enables the deposition of the Ag alloy reflective film according to the third embodiment of the present invention. The content of the Nd, Sn, Gd or In in the target is substantially equal to the content in the resulting reflective film.

The present invention will be described in further detail by referring to the following examples and comparative examples which by no means limit the scope of the present invention. Any modification of such examples without deviating the scope of the present invention is within the technical range of the present invention.

EXPERIMENTAL EXAMPLE 1

Thin films of Ag—Nd (Nd-containing Ag alloy), Ag—Sn (Sn-containing Ag alloy), Ag—Gd (Gd-containing Ag alloy), Ag—In (In-containing Ag alloy) and Ag—Nd—Sn (Nd—Sn-containing Ag alloy) were prepared, and the relationships between the contents of Nd, Sn, Gd and In, and the melting temperature, thermal conductivity and reflectivity of the thin films were determined.

The thin films were prepared in the following manner. On a glass substrate (Corning #1737 having a diameter of 50 mm and a thickness of 1 mm) were deposited thin films of Ag—Nd, Ag—Sn, Ag—Gd, Ag—In and Ag—Nd—Sn with a DC magnetron sputter at a substrate temperature of 22° C., an Ar gas pressure of 2 mTorr, a deposition rate of 5 nm/sec and a base pressure of less than $5 \times 10^{-6}$ Torr. The sputtering target was a composite target comprising a pure Ag target and chips of an alloying element arranged on the pure Ag target.

The melting temperature of a sample thin film was determined in the following manner. A sample Ag alloy thin film 1 μm thick (the Ag—Nd thin film, the Ag—Sn thin film, the Ag—Gd thin film, the Ag—In thin film or the Ag—Nd—Sn thin film) was stripped from the substrate, and about 5 mg of the stripped thin film was subjected to measurement with a differential calorimeter. The melting temperature of the sample thin film was defined as the average of a temperature at which the thin film was completely fused in the course of temperature rise, and a temperature at which the thin film began to solidify in the course of temperature fall. The thermal conductivity was determined by converting from the electric resistivity of a sample Ag alloy thin film 100 nm thick. The reflectivity of a sample Ag alloy thin film was determined at a wavelength of 405 nm after the deposition of the thin film and after a test with constant temperature and humidity (environmental test). The test with constant temperature and humidity (environmental test) was carried out at a temperature of 80° C. and relative humidity (RH) of 90% for hundred hours.

The results are shown in Table 1. In Table 1, the contents of Nd, Sn, Gd, In in the Ag—Nd, Ag—Sn, Ag—Gd, Ag—In, and Ag—Nd—Sn thin films in the column of the composition are each expressed as an atomic percent. Specifically, "Ag-x.Nd" represents a Ag alloy containing x atomic percent of Nd (Ag—Nd alloy); "Ag-y.Sn" represents a Ag alloy containing y atomic percent of Sn (Ag—Sn alloy); "Ag-z.Gd" represents a Ag alloy containing z atomic percent of Gd (Ag—Gd alloy); and "Ag-w.In" represents a Ag alloy containing w atomic percent of In (Ag—In alloy). "Ag-5.0Nd", for example, represents a Ag alloy containing 5.0 atomic percent of Nd.

Table 1 shows that the thermal conductivity and the melting temperature decrease with decreasing contents of Nd, Sn, Gd and In.

The thin films containing these elements in a total content of 3.0 atomic percent or less fail to exhibit a sufficiently low thermal conductivity. The thin films containing these elements in a total content of more than 10 atomic percent fail to exhibit a sufficiently high reflectivity.

These results show that the total amount (total content) of Nd, Sn, Gd and In should be more than 3.0 atomic percent and equal to or less than 10 atomic percent and is preferably from 3.2 to 8 atomic percent.

EXPERIMENTAL EXAMPLE 2

Thin films of Ag-5.0Nd—Bi (thin films of Ag alloys each containing 5.0 atomic percent of Nd and a certain amount of Bi) and thin films of Ag-5.0Nd—Sb (thin films of Ag alloys each containing 5.0 atomic percent of Nd and a certain amount of Sb) were prepared, and the relationships between the content of Bi or Sb and the thermal conductivity and reflectivity of the thin films were determined.

The thin films were prepared in the following manner. On a glass substrate (Corning #1737 having a diameter of 50 mm and a thickness of 1 mm) were deposited thin films of Ag-5.0Nd—Bi and Ag-5.0Nd—Sb with a DC magnetron sputter at a substrate temperature of 22° C., an Ar gas pressure of 2 mTorr, a deposition rate of 5 nm/sec and a base pressure of less than $5 \times 10^{-6}$ Torr. The sputtering target was a composite target comprising a pure Ag target and chips of an alloying element arranged on the pure Ag target.

The thermal conductivity was determined by converting from the electric resistivity of a sample Ag alloy thin film 100 nm thick. The reflectivity of a sample Ag alloy thin film was determined at a wavelength of 405 nm after the deposition of the thin film and after the test with constant temperature and humidity (environmental test) at a temperature of 80° C. and relative humidity (RH) of 90% for hundred hours.

The results are shown in Table 2. In Table 2, the Bi content in the Ag-5.0Nd—Bi thin films and the Sb content in the Ag-5.0Nd—Sb thin films in the column of the composition are each expressed as an atomic percent. Specifically, "Ag-5.0Nd-a.Bi" represents a Ag alloy containing 5.0 atomic percent of Nd and a atomic percent of Bi (Ag—Nd—Bi alloy). "Ag-5.0Nd-1.0Bi", for example, represents a Ag alloy containing 5.0 atomic percent of Nd and 1.0 atomic percent of Bi.

Table 2 shows that the addition of Bi or Sb prevents the reflectivity from decreasing after the environmental test (decreased reflectivity due to corrosion or cohesion in the test with constant temperature and humidity). The reflectivity is not effectively prevented from decreasing at a content of these elements of less than 0.01 atomic percent but is effectively prevented at a content of these elements of 0.01 atomic percent or more.

The reflectivity of the thin films decreases with an increasing content of Bi and/or Sb and is very low at a content of Bi and/Sb of more than 3.0 atomic percent.

The content of Bi and/or Sb is preferably 0.01 to 3.0 atomic percent based on these results.

EXPERIMENTAL EXAMPLE 3

Thin films of Ag-3.2Nd—(La,Mn,Cu,Zn) (thin films of Ag alloys each containing 3.2 atomic percent of Nd and a certain amount of one of La, Mn, Cu and Zn) and thin films of Ag-1.0Nd-5.0Sn—Cu (thin films of Ag alloys each containing 1.0 atomic percent of Nd, 5.0 atomic percent of Sn and a certain amount of Cu) were prepared, and the relationships between the content of La, Mn, Cu or Zn and the melting temperature, thermal conductivity and reflectivity of the thin films were determined.

The thin films were prepared in the following manner. On a glass substrate (Corning #1737 having a diameter of 50 mm and a thickness of 0.7 mm) were deposited thin films of Ag-3.2Nd—(La,Mn,Cu,Zn) and Ag-1.0Nd-5.0Sn—Cu with a DC magnetron sputter under the same condition as Experimental Example 2. The sputtering target was a composite target comprising a pure Ag target and chips of an alloying element arranged on the pure Ag target.

The melting temperature of a sample thin film was determined in the following manner. A sample Ag alloy thin film 1 μm thick was stripped from the substrate, and about 5 mg of the stripped thin film was subjected to measurement with a differential calorimeter. The melting temperature of the sample thin film was defined as the average of a temperature at which the thin film was completely fused in the course of temperature rise, and a temperature at which the thin film began to solidify in the course of temperature fall. The thermal conductivity was determined by converting from the electric resistivity of a sample Ag alloy thin film 100 nm thick. The reflectivity of a sample Ag alloy thin film was determined at a wavelength of 405 nm.

The results are shown in Table 3. In Table 3, the contents of La, Mn, Cu and Zn in the Ag-3.2Nd—(La,Mn,Cu,Zn) thin films and the Cu content in the Ag-1.0Nd-5.0Sn—Cu thin films in the column of the composition are each expressed as an atomic percent. Specifically, "Ag-3.2Nd-b La (or Mn, Cu or Zn)" represents a Ag alloy containing 3.2 atomic percent of Nd and b atomic percent of La (or Mn, Cu or Zn) [Ag—Nd—(La,Mn,Cu,Zn) alloy]. "Ag-3.2Nd-5.0La", for example, represents a Ag alloy containing 3.2 atomic percent of Nd and 5.0 atomic percent of La.

Table 3 shows that the thermal conductivity significantly decreases with the addition of La, Mn, Cu or Zn. The reflectivity of the thin film decreases with an increasing content of these elements and is very low at a content of these elements of more than 20 atomic percent.

These results show that the total content of La, Mn, Cu and Zn is preferably 20 atomic percent or less.

TABLE 1

| Composition | Melting temperature (° C.) | Electric resistivity (μΩcm) | Thermal conductivity (W/(cm · K)) | Reflectivity (%) | |
|---|---|---|---|---|---|
| | | | | After deposition | After environmental test |
| pure Ag | 960 | 2.4 | 3.2 | 93.2 | 70.2 |
| Ag—0.5Nd | 958 | 4.8 | 1.57 | 90.4 | 85.3 |
| Ag—1.0Nd | 955 | 7.3 | 1.03 | 87.0 | 84.3 |
| Ag—5.0Nd | 910 | 26.9 | 0.28 | 75.7 | 70.3 |
| Ag—10.0Nd | 820 | 40.2 | 0.19 | 61.8 | 60.2 |
| Ag—15.0Nd | 920 | 76.2 | 0.10 | 55.2 | 50.3 |
| Ag—0.1Sn | 960 | 2.8 | 2.69 | 92.5 | 76.2 |
| Ag—1.0Sn | 957 | 7.1 | 1.06 | 88.2 | 85.2 |

TABLE 1-continued

| Composition | Melting temperature (° C.) | Electric resistivity (μΩcm) | Thermal conductivity (W/(cm · K)) | Reflectivity (%) After deposition | Reflectivity (%) After environmental test |
|---|---|---|---|---|---|
| Ag—5.0Sn | 905 | 25.8 | 0.29 | 72.2 | 68.2 |
| Ag—10.0Sn | 860 | 38.2 | 0.20 | 65.2 | 61.2 |
| Ag—15.0Sn | 806 | 75.1 | 0.10 | 54.3 | 51.3 |
| Ag—0.1Gd | 958 | 3.2 | 2.35 | 92.8 | 72.3 |
| Ag—1.0Gd | 947 | 10.5 | 0.72 | 88.0 | 76.2 |
| Ag—5.0Gd | 887 | 43.6 | 0.17 | 74.1 | 63.2 |
| Ag—10.0Gd | 869 | 80.2 | 0.09 | 71.8 | 64.3 |
| Ag—15.0Gd | 902 | 101.1 | 0.07 | 58.3 | 53.2 |
| Ag—0.01In | 960 | 2.5 | 3.01 | 93.0 | 78.6 |
| Ag—0.1In | 960 | 3.0 | 2.51 | 92.8 | 74.3 |
| Ag—3.2In | 944 | 21.3 | 0.35 | 82.3 | 76.6 |
| Ag—10.0In | 901 | 58.3 | 0.13 | 69.6 | 61.2 |
| Ag—20.0In | 831 | 110.2 | 0.07 | 44.3 | 48.6 |
| Ag—1.0Nd—1.0Sn | 942 | 12.4 | 0.60 | 84.1 | 78.5 |
| Ag—1.0Nd—3.0Sn | 923 | 23.0 | 0.30 | 78.1 | 73.2 |
| Ag—1.0Nd—5.0Sn | 880 | 35.8 | 0.20 | 70.2 | 66.9 |
| Ag—5.0Nd—10.0Sn | 823 | 74.3 | 0.10 | 51.8 | 48.2 |

TABLE 2

| Composition | Electric resistivity (μΩcm) | Thermal conductivity (W/(cm · K)) | Reflectivity (%) After deposition | Reflectivity (%) After environmental test |
|---|---|---|---|---|
| pure Ag | 2.4 | 3.2 | 93.2 | 70.2 |
| Ag—5.0Nd | 26.9 | 0.28 | 75.7 | 70.3 |
| Ag—5.0Nd—0.005Bi | 26.9 | 0.28 | 75.7 | 71.0 |
| Ag—5.0Nd—0.01Bi | 27.2 | 0.28 | 75.7 | 74.0 |
| Ag—5.0Nd—1.0Bi | 32.3 | 0.23 | 72.1 | 70.1 |
| Ag—5.0Nd—3.0Bi | 56.7 | 0.13 | 62.1 | 60.8 |
| Ag—5.0Nd—5.0Bi | 92.4 | 0.08 | 51.2 | 40.6 |
| Ag—5.0Nd—0.005Sn | 26.9 | 0.28 | 75.7 | 71.2 |
| Ag—5.0Nd—0.01Sn | 27.5 | 0.27 | 75.5 | 73.6 |
| Ag—5.0Nd—1.0Sn | 34.5 | 0.22 | 72.6 | 70.8 |
| Ag—5.0Nd—3.0Sn | 52.1 | 0.14 | 65.8 | 64.2 |
| Ag—5.0Nd—5.0Sn | 73.9 | 0.10 | 55.2 | 52.1 |

TABLE 3

| Composition | Melting temperature (° C.) | Electric resistivity (μΩcm) | Thermal conductivity (W/(cm · K)) | Reflectivity (%) |
|---|---|---|---|---|
| pure Ag | 960 | 2.4 | 3.14 | 93.2 |
| Ag—3.2Nd—0.5La | 932 | 21.6 | 0.35 | 81.2 |
| Ag—3.2Nd—1.0La | 931 | 23.7 | 0.32 | 79.8 |
| Ag—3.2Nd—10.0La | 812 | 72.3 | 0.10 | 68.5 |
| Ag—3.2Nd—20.0La | 865 | 98.2 | 0.08 | 62.1 |
| Ag—3.2Nd—30.0La | 921 | 121.6 | 0.06 | 52.4 |
| Ag—3.2Nd—0.5Mn | 931 | 14.1 | 0.53 | 81.0 |
| Ag—3.2Nd—1.0Mn | 931 | 16.1 | 0.47 | 78.0 |
| Ag—3.2Nd—10.0Mn | 964 | 30.1 | 0.25 | 70.2 |
| Ag—3.2Nd—30.0Mn | 971 | 47.1 | 0.16 | 56.9 |
| Ag—3.2Nd—0.5Cu | 928 | 15.0 | 0.50 | 90.1 |
| Ag—3.2Nd—1.0Cu | 920 | 16.2 | 0.46 | 88.2 |
| Ag—3.2Nd—10.0Cu | 870 | 20.3 | 0.37 | 73.4 |
| Ag—3.2Nd—20.0Cu | 842 | 30.2 | 0.25 | 65.2 |
| Ag—3.2Nd—30.0Cu | 786 | 52.1 | 0.14 | 59.1 |
| Ag—3.2Nd—0.5Zn | 945 | 13.0 | 0.58 | 82.0 |
| Ag—3.2Nd—1.0Zn | 945 | 13.4 | 0.56 | 81.6 |
| Ag—3.2Nd—10.0Zn | 910 | 18.3 | 0.41 | 78.2 |
| Ag—3.2Nd—30.0Zn | 765 | 23.8 | 0.32 | 58.8 |
| Ag—1.0Nd—5.0Sn—2.0Cu | 872 | 39.5 | 0.19 | 66.2 |
| Ag—1.0Nd—5.0Sn—5.0Cu | 840 | 42.1 | 0.18 | 61.8 |

The samples in the above experimental examples comprise either one of Nd, Sn, Gd and In, or a combination of Nd and Sn. Likewise, the samples comprise either one of Bi and Sb, and/or either one of La, Mn, Cu and Zn. Similar results to above are obtained by incorporating other combinations of two or more of Nd, Sn, Gd and In, by incorporating both Bi and Sb, and by incorporating two or more of La, Mn, Cu and Zn.

The Ag alloy reflective film for an optical information recording medium according to the present invention enables easy laser marking in read-only optical discs and can be suitably used as a reflective film for an optical information recording medium serving as a read-only optical disc.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A Ag alloy sputtering target for the deposition of a Ag alloy reflective film for an optical information recording medium, consisting of:
   Ag as a main component;
   Nd in a total amount of more than 3.0 atomic percent and less than or equal to 10 atomic percent; and
   at least one element selected from the group consisting of Sn, In, Bi, Sb, Mn, Cu, La, and Zn,
   wherein when Sn or In is present the total amount of Nd, Sn, and In is less than or equal to 10 atomic percent,
   wherein when Bi or Sb is present it is in an amount ranging from 0.01 to 3 atomic percent,
   wherein when Mn, Cu, La or Zn is present it is in an amount of 20 atomic percent or less, and
   wherein Sb is present in an amount ranging from 0.01 to 3 atomic percent.

2. A Ag alloy reflective film for an optical information recording medium, consisting of:
   Ag as a main component;
   Nd in a total amount of more than 3.0 atomic percent and less than or equal to 10 atomic percent; and
   at least one element selected from the group consisting of Sn, In, Bi, Sb, Mn, Cu, La, and Zn,
   wherein when Sn or In is present the total amount of Nd, Sn, and In is less than or equal to 10 atomic percent,
   wherein when Bi or Sb is present it is in an amount ranging from 0.01 to 3 atomic percent,
   wherein when Mn, Cu, La or Zn is present it is in an amount of 20 atomic percent or less, and
   wherein Sb is present in an amount ranging from 0.01 to 3 atomic percent.

3. A Ag alloy reflective film for an optical information recording medium, consisting of Ag, Nd, Gd, Cu, and Sn; wherein the total amount of Nd, Gd, and Sn is less than or equal to 10 atomic percent, and Cu is in an amount of 20 atomic percent or less.

4. A Ag alloy sputtering target for the deposition of a Ag alloy reflective film for an optical information recording medium consisting of Ag, Nd, Gd, Cu, and Sn; wherein the total amount of Nd, Gd, and Sn is less than or equal to 10 atomic percent, and Cu is in an amount of 20 atomic percent or less.

5. A Ag alloy reflective film for an optical information recording medium, consisting of:
   Ag as a main component;
   Gd in a total amount of more than 3.0 atomic percent and less than or equal to 10 atomic percent; and
   at least one element selected from the group consisting of Sn, In, Bi, Sb, Mn, Cu, La, and Zn,
   wherein when Sn or In is present the total amount of Gd, Sn, and In is less than or equal to 10 atomic percent,
   wherein when Bi or Sb is present it is in an amount ranging from 0.01 to 3 atomic percent, and
   wherein when Mn, Cu, La or Zn is present it is in an amount of 20 atomic percent or less.

6. The Ag alloy reflective film according to claim 5, wherein at least one of Bi and Sb is present in a concentration of 0.01 to 3 atomic percent.

7. The Ag alloy reflective film according to claim 5, wherein at least one of Mn, Cu, La and Zn is present in a concentration of 20 atomic percent or less.

8. The Ag alloy reflective film accordingly to claim 5, wherein at least one of Sn and In is present, wherein the total amount of components Gd, Sn, and In is more than 3.0 atomic percent and less than or equal to 10 atomic percent.

9. The Ag alloy sputtering target according to claim 5, wherein Sb is present in an amount ranging from 0.01 to 3 atomic percent.

10. The Ag alloy sputtering target according to claim 5, wherein Bi is present in an amount ranging from 0.01 to 3 atomic percent.

11. An optical information recording medium comprising the Ag alloy reflective film of claim 5.

12. The optical information recording medium according to claim 11, for use in laser marking.

13. The optical information recording medium of claim 11, wherein the thickness of the Ag alloy reflective film ranges from 5 nm to 200 nm.

14. The optical information recording medium of claim 11, wherein the thickness of the Ag alloy reflective film ranges from 10 nm to 100 nm.

15. A Ag alloy sputtering target for the deposition of a Ag alloy reflective film for an optical information recording medium, consisting of:
   Ag as a main component;
   Gd in a total amount of more than 3.0 atomic percent and less than or equal to 10 atomic percent; and
   at least one element selected from the group consisting of Sn, In, Bi, Sb, Mn, Cu, La, and Zn,
   wherein when Sn or In is present the total amount of Gd, Sn, and In is less than or equal to 10 atomic percent,
   wherein when Bi or Sb is present it is in an amount ranging from 0.01 to 3 atomic percent, and
   wherein when Mn, Cu, La or Zn is present it is in an amount of 20 atomic percent or less.

16. The Ag alloy sputtering target according to claim 15, wherein Sb is present in an amount ranging from 0.01 to 3 atomic percent.

17. The Ag alloy sputtering target according to claim 15, wherein Bi is present in an amount ranging from 0.03 to 10 atomic percent.

18. The Ag alloy sputtering target according to claim 15, wherein at least one of Mn, Cu, La and Zn is present in a concentration of 20 atomic percent or less.

19. The Ag alloy sputtering target according to claim 15, wherein at least one of Sn and In is present, wherein the total amount of components Gd, Sn, and In is more than 3.0 atomic percent and less than or equal to 10 atomic percent.

* * * * *